(12) United States Patent  (10) Patent No.: US 9,855,783 B2
Stone                       (45) Date of Patent:    Jan. 2, 2018

(54) ELECTRONIC DEVICE

(75) Inventor: Kate Stone, Cambridge (GB)

(73) Assignee: NOVALIA LTD. (GB)

( * ) Notice: Subject to any disclaimer, the term of this patent is extended or adjusted under 35 U.S.C. 154(b) by 900 days.

(21) Appl. No.: 13/810,331

(22) PCT Filed: Jul. 15, 2011

(86) PCT No.: PCT/GB2011/051333
§ 371 (c)(1),
(2), (4) Date: Jan. 15, 2013

(87) PCT Pub. No.: WO2012/007765
PCT Pub. Date: Jan. 19, 2012

(65) Prior Publication Data
US 2013/0119652 A1  May 16, 2013

(30) Foreign Application Priority Data

Jul. 16, 2010  (GB) .................................. 1012012.9
Jan. 28, 2011  (GB) .................................. 1101509.6

(51) Int. Cl.
B42D 15/00 (2006.01)
H05K 13/00 (2006.01)
(Continued)

(52) U.S. Cl.
CPC ............ *B42D 15/00* (2013.01); *B32B 37/185* (2013.01); *B42D 1/007* (2013.01); *B42D 15/022* (2013.01); *H05K 3/4084* (2013.01); *H05K 3/4697* (2013.01); *H05K 7/06* (2013.01); *H05K 13/00* (2013.01); *B32B 37/142* (2013.01); *B32B 38/10* (2013.01); *B32B 38/105* (2013.01); *B32B 2305/34* (2013.01); *B32B 2457/00* (2013.01);
(Continued)

(58) Field of Classification Search
CPC .............................................. Y10T 428/24802
See application file for complete search history.

(56) References Cited

U.S. PATENT DOCUMENTS 5,018,051 A  5/1991  Yamada et al.
5,502,463 A  3/1996  Sasaki et al.
(Continued)

FOREIGN PATENT DOCUMENTS

DE  4312672 A1  10/1994
DE  19811076 A1  9/1999
(Continued)

OTHER PUBLICATIONS

Patent Abstracts of Japan, Toshiba Corp., Publication No. JP 03194643 A, published Aug. 26, 1991 (1 page).
(Continued)

*Primary Examiner* — Mark Ruthkosky
*Assistant Examiner* — Sathavaram I Reddy
(74) *Attorney, Agent, or Firm* — Ware, Fressola, Maguire & Barber LLP

(57) ABSTRACT

A device comprising a laminate (2) comprising at least two layers ($3_1$, $3_2$, $3_3$, $3_4$, $3_5$) and a plurality of electronic components (5, 6, 7, 8) disposed between two layers. At least one of the layers ($3_1$, $3_4$) supports conductive tracks (10, 11) arranged to connect electronic components.

36 Claims, 7 Drawing Sheets

(51) Int. Cl.
  *H05K 7/06* (2006.01)
  *B32B 37/18* (2006.01)
  *B42D 1/00* (2006.01)
  *B42D 15/02* (2006.01)
  *H05K 3/40* (2006.01)
  *H05K 3/46* (2006.01)
  *B32B 37/14* (2006.01)
  *B32B 38/10* (2006.01)
  *B32B 38/00* (2006.01)
  *H05K 1/18* (2006.01)
  *H05K 3/04* (2006.01)
  *H05K 3/12* (2006.01)

(52) U.S. Cl.
  CPC . *H01H 2211/012* (2013.01); *H01H 2229/004* (2013.01); *H05K 1/185* (2013.01); *H05K 3/046* (2013.01); *H05K 3/1241* (2013.01); *H05K 2201/055* (2013.01); *H05K 2201/091* (2013.01); *Y10T 29/49002* (2015.01)

(56) References Cited

U.S. PATENT DOCUMENTS

| | | | | |
|---|---|---|---|---|
| 5,803,748 | A * | 9/1998 | Maddrell | G09B 5/062 345/901 |
| 7,106,208 | B2 * | 9/2006 | Devos | B42D 3/12 340/686.1 |
| 2006/0227523 | A1 | 10/2006 | Pennaz et al. | |
| 2007/0018998 | A1 | 1/2007 | Hagglund et al. | |
| 2007/0128905 | A1 * | 6/2007 | Speakman | H05K 1/0265 439/161 |
| 2008/0191174 | A1 | 8/2008 | Ehrensvard et al. | |
| 2011/0059426 | A1 * | 3/2011 | Mamigonians | G09B 5/062 434/317 |
| 2011/0212429 | A1 | 9/2011 | Stone | |

FOREIGN PATENT DOCUMENTS

| | | |
|---|---|---|
| GB | 2464537 A | 4/2010 |
| JP | 3194643 A | 8/1991 |
| JP | 11345300 A | 12/1999 |
| JP | 2006301085 A | 11/2006 |
| WO | 9412963 A1 | 6/1994 |
| WO | 02084587 A1 | 10/2002 |
| WO | 2004077286 A1 | 9/2004 |
| WO | 2007006633 A1 | 1/2007 |
| WO | 2007035115 A1 | 3/2007 |

OTHER PUBLICATIONS

Patent Abstracts of Japan, Toppan Forms Co. Ltd., Publication No. JP 2006301085 A, published Nov. 2, 2006 (1 page).
GB Search Report, Application No. 1101509.6 dated Apr. 20, 2011 (2 pages).
Patent Abstracts of Japan, Hitachi Chem. Co. Ltd., Publication No. JP 11345300 A, published Dec. 14, 1999 (1 page).
Bibliographic Data, Publication No. DE 4312672 A1, Kulpers, Ulrich, Prof. Dr. -Ing., published Oct. 20, 1994 (2 pages).
Bibliographic Data, Publication No. DE 19811076 A1, Curten, Achim, published Sep. 16, 1999 (2 pages).

* cited by examiner

ELECTRONIC DEVICE

FIELD OF THE INVENTION

The present invention relates to an electronic device.

BACKGROUND

Electronic components are increasingly being incorporated into printed articles, such as books, posters and greeting cards, to allow printed articles to become more interactive. Examples of interactive printed articles are described in GB 2 464 537 A, WO 2004 077286 A, WO 2007 035115 A and DE 1993 4312672 A.

SUMMARY

The present invention seeks to provide an electronic device which is easier to fabricate.

According to a first aspect of the present invention there is provided an electronic device comprising a laminate which comprises at least two layers and a plurality of electronic components disposed between two layers, wherein at least one of the layers support conductive tracks arranged to connect electronic components.

Thus, the tracks can be provided on the layers before the laminate is formed and can minimise or even avoid the need for wires. This allows electrical components to be interconnected in a simple way and be made, for example, using printing and/or converting processes, such as cutting, creasing and laminating.

The conductive tracks may comprise conductive ink printed on at least one of the layers. The conductive ink may comprise a metal-based conductive ink, such as a silver- or copper-based conductive ink. The conductive ink may be a carbon-based conductive ink. The conductive tracks may comprise a conductive polymer. The conductive tracks may be transparent. The conductive tracks may comprise a foil comprising, for example, aluminium, copper, gold or silver.

The layers may include sheets of card, paper or plastic. The layers may themselves be laminates, e.g. a sheet of paper sandwiched between sheets of plastic. The top and/or bottom layers can include window, apertures and/or flaps. The layer may support printed indicia such as text and/or graphics. The layers may comprise the same material and/or may have the same thickness.

The laminate may comprise two layers. This can allow simple devices to me made, for example, by forming tracks on one sheet, mounting the components and folding the sheet.

The laminate may comprise at least three layers including first and second outer layers and at least one intermediate layer interposed between the first and second outer layers and configured to provide at least one cavity. Each intermediate layer may include at least one aperture. The intermediate layers may comprise the same material and/or may have the same thickness. The laminate may comprise at least two intermediate layers, at least three intermediate layers or at least four intermediate layers. The laminate may comprise no more than three intermediate layers, no more than four intermediate layers or no more than five intermediate layers. The laminate may comprise no more than six intermediate layers.

The laminate may comprise at least three layers including first and second outer layers and at least one intermediate layer interposed between the first and second outer layers. At least some of the electronic components may be disposed between two adjacent layers. At least some of the electronic components may be disposed between two non-adjacent layers.

The laminate may include first and second intermediate layers. An area of the first intermediate layer may lie in a plane and the second layer may pass from above or in the plane outside the area under the plane inside the area. The second layer may support at least one conductive track. This can allow complex circuits to be constructed by, for example, connecting components or tracks in different layers and/or crossing tracks without the tracks being connected. Thus, the track can form a conductive via.

The conductive via can be routed between any of the layers in the laminate and so a three-dimensional electrical circuit can be formed by forming (e.g. by printing) conductive tracks on various layers, cutting the layers and laminating the layers together. Components can be embedded at any level in the stack and conductive tracks can be routed between layers to connect all the components together.

The laminate may have a thickness of at least 2 mm, at least 3 mm or at least 4 mm. The laminate may have a thickness no more than about 5 mm. Thus, thin devices having a thickness of between 2 and 5 mm can be formed, thereby allowing the to be incorporated into other articles, such as a book, poster, game, product packaging, point of sale displays etc. For example, the laminate may be a cover of a book.

The laminate may have an area of 50 $cm^2$, at least 100 $cm^2$ or at least 200 $cm^2$. Thus, the device can be handheld or portable.

The laminate may have a thickness of at least 5 mm or at least 10 mm. The laminate may have an area of at least 500 $cm^2$, at least 1 $m^2$ or at least 2 $m^2$. Thus, the electronic device can easily be scaled up in size and to form substantial devices, for example, posters.

The laminate may have a thickness no more than 50 mm, no more than 20 mm or no more than 10 mm.

Each intermediate layer includes at least one aperture. At least two apertures in adjacent intermediate layers may be co-extensive. Thus, large cavities can be formed by stacking layers.

The laminate may include at least four layers, at least five layers or at least six layers.

The layers may each comprise a respective portion of one sheet. This can simplify formation of the laminate. For example, the sheet may be folded to form the laminate. The sheet may include slit or slots allowing a first portion of the sheet to be folded along a line which extends into a different portion of the sheet which is unfolded or folded in a different way. This can help allow laminates with complex layers structures to be formed. The laminate may be trimmed so as to remove folded edges.

The plurality of electronic components may include at least one battery, at least one photovoltaic cell, at least one speaker, at least one integrated circuit, at least one transistor, at least one resistor, at least one capacitor, at least one inductor, connector, at least one light emitting diode, at least one display, at least one sensor, at least one transducer and/or other forms of active or passive discrete component.

The device may further comprise at least one switch. The switch may be formed using at least three layers of the laminate and comprises a first region of conductive material disposed on a surface of first layer and a second region of conductive material disposed on a facing surface of a second layer, wherein the third layer spaces apart the first and second layers. The switch may comprise a capacitive sensing switch. The device may further comprise at least one light emitter, such as light emitting diode. Switches, light emitting diodes and/or other forms of electronic components, such as sensors, displays or transducers, need not be formed in a cavity but can be integrated into the laminate or mounted to the surface or edge of the laminate.

Components may be attached to tracks using conductive glue or conductive tape, for example, anisotropic conductive film. Some components, such as a battery and piezoelectric speaker, may have contacts on both sides.

The device may be a book, game, greeting card, poster, product packaging, point of sale display or other form of printed article.

According to a second aspect of the present invention there is provided a method comprising providing a laminate comprising at least two layers, providing a plurality of electronic components between at least two layers and providing conductive tracks on at one of the layers to connect electronic components.

The method can minimise or remove the need for hand assembly of the device, which can be a board game or other type of device. The method can be easily scaled up not only in terms of the number of devices which can be made, but also in terms of the size of the device.

The laminate may comprise at least three layers including first and second outer layers and at least one intermediate layer interposed between the first and second outer layers and the method may further comprise configuring the at least one intermediate layer to provide at least one cavity. Providing the plurality of electronic components between at least two layers may comprise providing the plurality of electronic components in the at least one cavity.

Providing conductive tracks on at least some of the layers may comprise printing conductive ink on at least one of the layers.

Configuring the at least one intermediate layer to provide at least one cavity may comprise forming at least one aperture in an intermediate layer, for example, by punching or cutting out part of an intermediate layer.

Providing the laminate may include folding a sheet having first and second faces at least once. This can simply manufacture of the laminate.

The method may further comprise providing at least one slit or slot extending from an edge of the sheet before folding. This can allow the sheet to be folded in more complex ways.

The method may comprise printing conductive tracks on the first face of the sheet.

BRIEF DESCRIPTION OF THE DRAWINGS

Certain embodiments of the present invention will now be described, by way of example, with reference to the accompanying drawings, in which.

DETAILED DESCRIPTION OF CERTAIN EMBODIMENTS

Figure 1:
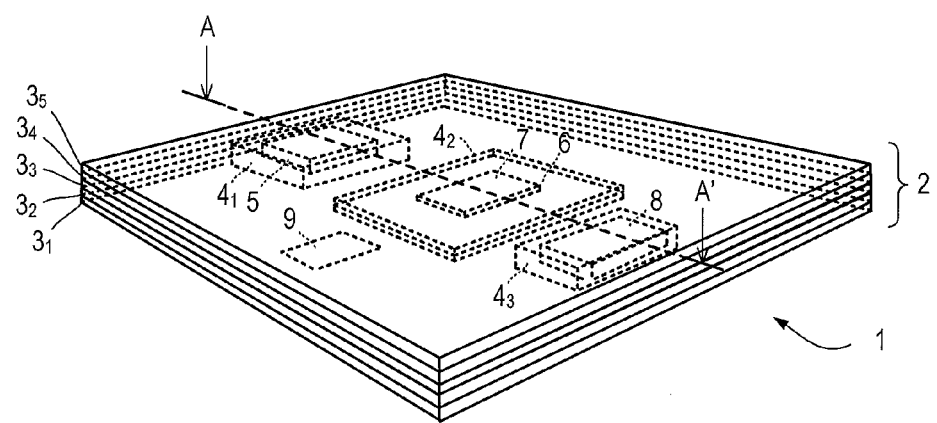
FIG. 1 is perspective view of a device in accordance with the present invention.
Figure 2:
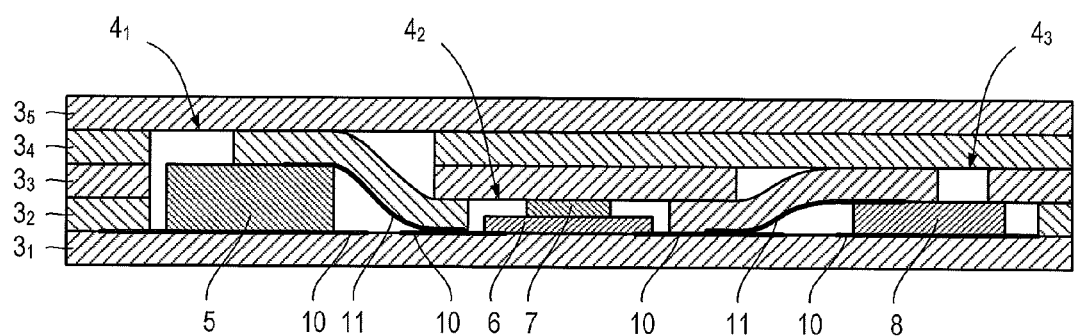
FIG. 2 is a cross section of the device shown in FIG. 1 taken along the line A-A'.

Referring to FIGS. 1 and 2, a device 1 (herein also referred to as an "interactive article") in accordance with the present invention is shown.

The interactive article 1 comprises a laminate 2 comprising five layers $3_1$, $3_2$, $3_3$, $3_4$, $3_5$ of card including first and second outer layers $3_1$, $3_5$ (hereinafter referred to a "bottom layer" and "top layer" respectively) and three intermediate layers $3_2$, $3_3$, $3_4$ interposed between the bottom and top layers $3_1$, $3_5$. The layers $3_1$, $3_2$, $3_3$, $3_4$, $3_5$ have the same thickness and, in this example, each have a density of about 200 $gm^{-2}$. However, the layers $3_1$, $3_2$, $3_3$, $3_4$, $3_5$ need not all have the same thickness and can have different densities, for example, having a higher density up to 350 $gm^{-2}$ or more. The layers $3_1$, $3_2$, $3_3$, $3_4$, are held together with an adhesive (not shown).

The intermediate layers $3_2$, $3_3$, $3_4$ are patterned to provide cavities $4_1$, $4_2$, $4_3$, for example, by cutting or stamping out parts of the layers $3_2$, $3_3$, $3_4$. The top and/or bottom layers $3_1$, $3_5$ may also be patterned to provide holes, slots or windows to allow passage of light or sound, or to house an electronic component, such as a light emitting diode.

Electronic components 5, 6, 7, 8 are housed in the cavities $4_1$, $4_2$, $4_3$. In this the electronic components 5, 6, 7, 8 include a battery 5, a printed circuit board 6, carrying a microcontroller 7 and other components (not shown), and a piezoelectric speaker 8. The interactive article 1 may include other electronic components 9 which are not housed in a cavity, but which are disposed in, on and/or between layers. In this case, a switch 9 in the form of a capacitive sensing pad is provided on the bottom layer $3_1$ but which is not housed in a cavity.

The interactive article 1 may be a book, game, greeting card, poster, calendar, product packaging (such as a carton), point of sale display or other form of printed article.

Referring in particular to FIG. 2, the bottom layer $3_1$ supports conductive tracks 10 which connect the battery 5, printed circuit board 6 and piezoelectric speaker 8. In this example, the tracks 10 are formed by printing conductive ink on the upper face of the first layer $3_1$. However, in some embodiments, the tracks 10 may comprise foil formed by hot- or cold-foil stamping. The electronic components 5, 6, 8 are connected to the tracks 10 using conductive glue or conductive anisotropic film (not shown). The fourth layer $3_4$ also supports conductive tracks 11 which connect the battery 5, printed circuit board 6 and piezoelectric speaker 8. The tracks 11 are formed by printing conductive ink on the underside of the fourth layer $3_4$.

Figure 3:
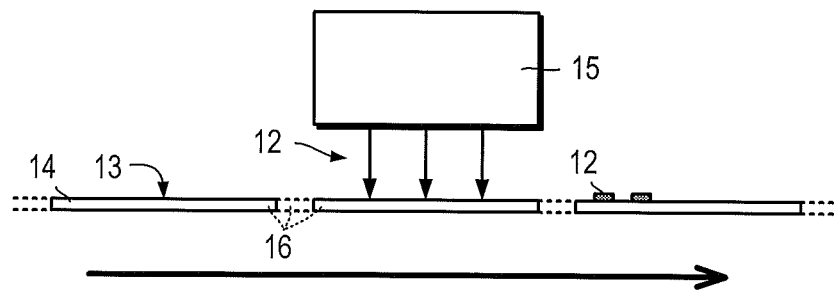
FIG. 3 illustrates a printing stage.
Figure 4:
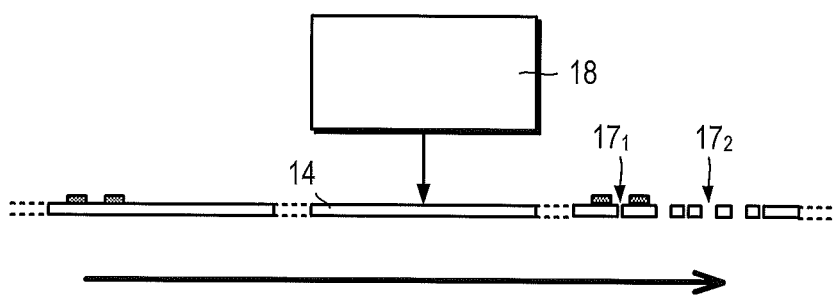
FIG. 4 illustrates a cutting stage.
Figure 5:
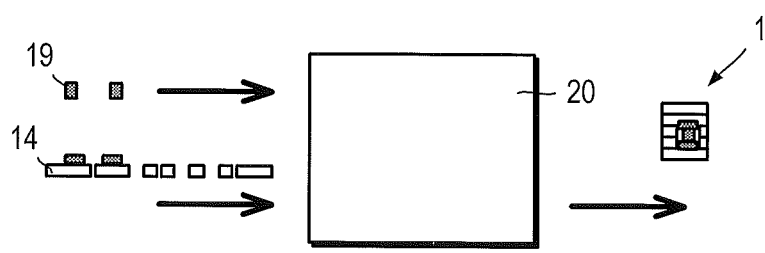
FIG. 5 illustrates a laminating stage.

Referring to FIGS. 3, 4 and 5, a method of manufacturing the interactive article 1 will now be described.

Referring to FIG. 3, conductive ink 12 is printed on a face 13 of a sheet 14 using a printer 15. Screen printing, ink jet printing, flexography or offset printing or gravure can be used.

As will be explained in more detail later, the layers $3_1$, $3_2$, $3_3$, $3_4$, $3_5$ (FIG. 2) may form part of the same sheet 14 which is creased and folded while the layers $3_1$, $3_2$, $3_3$, $3_4$, $3_5$ (FIG. 2) are still connected. Alternatively, the layers $3_1$, $3_2$, $3_3$, $3_4$, $3_5$ (FIG. 2) may be provided as separate sheets 14 and conductive ink 12 is printed on only some of the sheets 14, i.e. sheets corresponding to layers, such as the first layer $3_1$ (FIG. 2), requiring conductive ink.

A sheet-based process may be used. For example, the printer 15 may print a series of sheets 14, each sheet 14 corresponding to the layers $3_1$, $3_2$, $3_3$, $3_4$, $3_5$ (FIG. 2).

Alternatively, a roll-to-roll process may be used. Thus, the sheets 14 may form part of a web 16. For example, the layers $3_1$, $3_2$, $3_3$, $3_4$, $3_5$ (FIG. 2) may form a section of the web 16 or be adjacently arranged in a given area. This allows the web 16 to be cut, e.g. in into sections, each section providing a sheet 14 corresponding to the layers $3_1$, $3_2$, $3_3$, $3_4$, $3_5$ (FIG. 2). Instead, separate webs can be used for different layers. Thus, a given web can be cut to provide layers of one given type.

As explained earlier, conductive ink need not be used. For example, a metal foil may be stamped onto the surface of the sheet 14 using, for example, a hot foil process. The foil may comprise aluminium, copper, silver, gold or other suitable metal.

Referring to FIG. 4, slits $17_1$ can be cut in the sheet 14 and apertures or slots $17_2$ cut out from the sheet 14 using a cutting machine 18, such as planar cutter form or a rotary die cutter. A sheet-based process may be used. Alternatively, a roll-to-roll process may be used. The cutting process may define the sheets 14.

Referring to FIG. 5, electronic components 19 are mounted on the sheets 14, adhesive (not shown) is applied to the sheet 14 and the sheet 14 is folded to form the device 1 using one or more converting machine(s) 20. The electronic components 19 may be mounted from a web or using a pick-and-place robot (not shown).

FIGS. 6a to 6d illustrate the article 1 at different stages during manufacture. Although the layers $3_1$, $3_2$, $3_3$, $3_4$, $3_5$ are shown separately in FIGS. 6a to 6d, the layers $3_1$, $3_2$, $3_3$, $3_4$, $3_5$ may in fact form part of the same sheet, as shown by lines in chain.

Figure 6A:
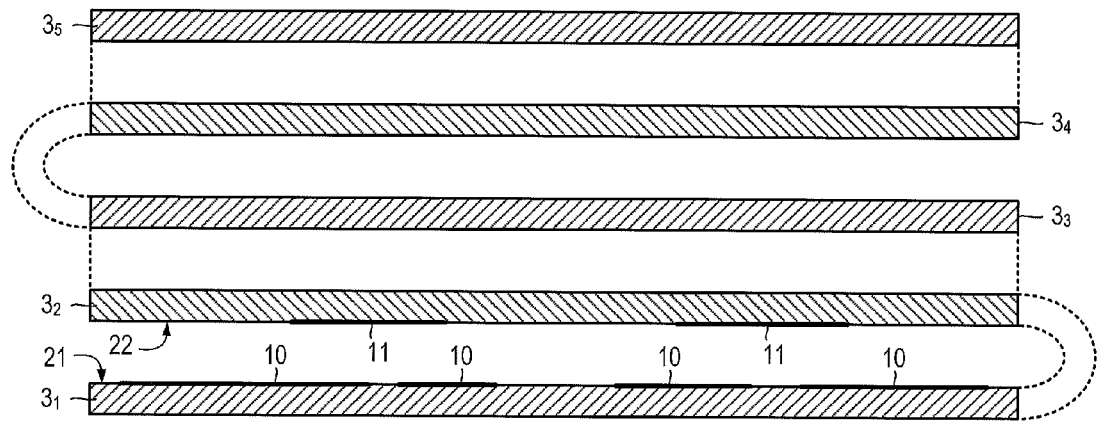
FIGS. 6a to 6d illustrates the device shown in FIG. 1 taken along the line A-A' at different stages during manufacture.

FIG. 6a show the layers $3_1$, $3_2$, $3_3$, $3_4$, $3_5$ after a printing stage. A first layer $3_1$ supports conductive tracks 10 on an upper face 21 and the second layer $3_2$ support conductive tracks 11 on a lower face 22. However, as will be explained in more detail later, the first and second layers $3_1$, $3_2$ may simply be different parts of the same sheet 14 with the sheet 14 folded.

Figure 6B:
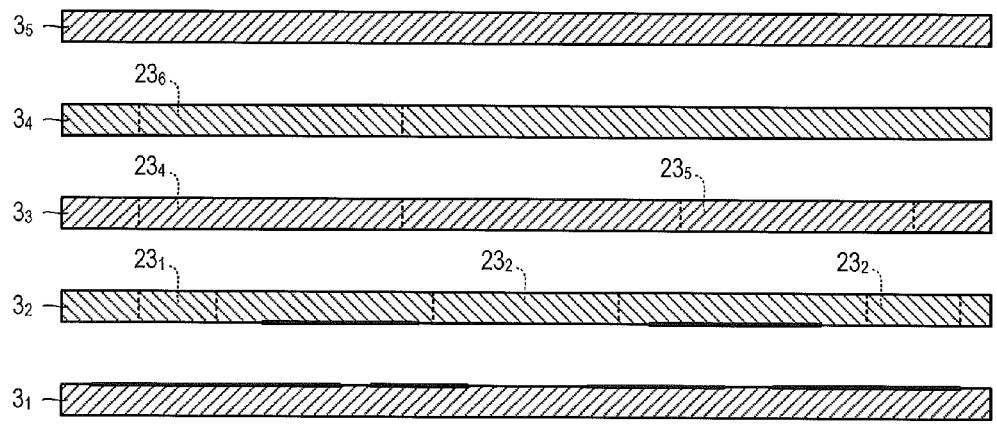

As shown in FIG. 6b, during a cutting stage, regions $23_1$, $23_2$, $23_3$, $23_4$, $23_5$, $23_6$ of the second, third and fourth layers $3_2$, $3_3$, $3_4$ are cut out (e.g. stamped out).

Figure 6C:
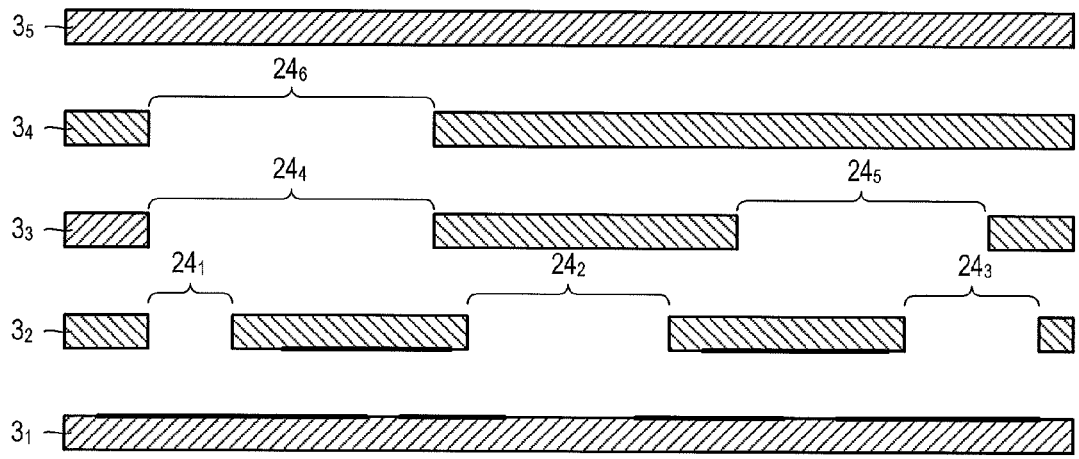

As shown in FIG. 6c, after the cutting stage, apertures $24_1$, $24_2$, $24_3$, $24_4$, $24_5$, $24_6$ are formed in the second, third and fourth layers $3_2$, $3_3$, $3_4$. An aperture $24_4$ in the third layer $3_3$ is aligned with an aperture $24_6$ in the fourth layer $3_4$.

Figure 6D:
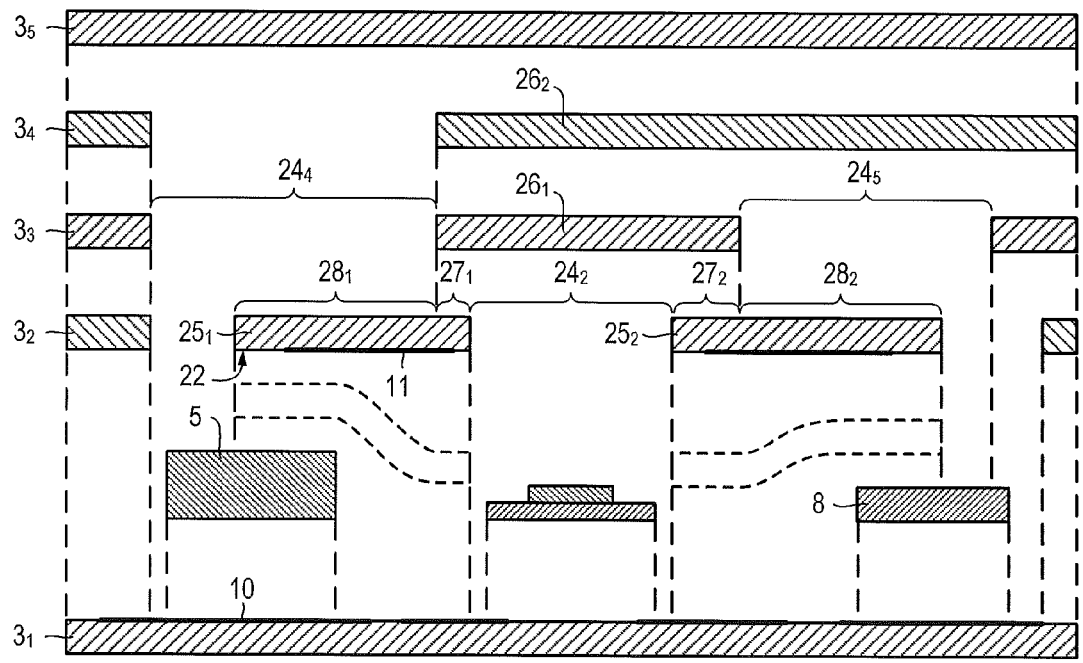

FIG. 6d shows the article 1 during a laminating stage.

As shown in FIG. 6d, first and second regions $25_1$, $25_2$ of the second layer $3_2$ overlap the battery 5 and piezoelectric speaker 8. An aperture $24_2$ is defined between the first and second regions $25_1$, $25_2$ of the second layer $3_2$ which forms a cavity $4_2$ for the printed circuit board 7. A region or strip $26_1$ of the third layer $3_3$ runs over the aperture $24_2$ and overlaps inner portions $27_1$, $27_2$ of the first and second regions $25_1$, $25_2$ of the second layer $3_2$. Thus, the strip $26_1$ (pressed down by an overlying strip $26_2$ of the fourth layer $3_4$) pushes down the inner portions $27_1$, $27_2$ of the second layer $3_2$.

Outer portions $28_1$, $28_2$ of the first and second regions $25_1$, $25_2$ of the second layer $3_2$ are not pushed down and are free to stay or rise to a different level by being pushed up by the battery 5 and piezoelectric speaker 8 into apertures $24_4$, $24_5$ in the third layer $3_3$.

The first and second regions $25_1$, $25_2$ have conductive ink on their undersides 22 and so conductive tracks 11 can be routed from the top of the components 5, 8 to conductive tracks 10 on the layer $3_1$ below.

Expressed differently, the second layer $3_2$ bends upwards in areas where it comes into contact with the upper surfaces of the battery 5 and piezoelectric speaker 8. The components 5, 8 have different heights and so the layer $3_2$ is routed to different heights in a self-organised way as it comes into contact with the battery 5 and piezoelectric speaker 8. The third layer $3_3$ forms cavities $4_1$, $4_3$ (FIG. 1) for the battery 5 and piezoelectric speaker 8. The fourth layer $3_4$ only forms a cavity $4_1$ (FIG. 1) for the battery 5 and also compresses the upper contact formed by second layer $3_2$ on top of the piezoelectric speaker 8. The top layer $3_5$ compresses the top contact formed by second layer $3_2$ on top of the battery 5. In this way, conductive tracks 11 can be routed to any layer using the components 5, 8 themselves to cause the layers to rise up to different levels with their upper surfaces.

The article 1 may be processed further, for example, by trimming edges of the laminate 2 and/or by covering the article 1 in a protective plastic layer.

This process can be carried out using printing and converting processes. Thus, the article 1 can be manufactured in a simple way.

A laminate can be created from several sheets laminated together each with a different pattern cut out and with different printed tracks and, if required, graphics. Several similar constructions can be created on one sheet.

As mentioned earlier, the layers $3_1$, $3_2$, $3_3$, $3_4$, $3_5$ (FIG. 2) can be cut out from one sheet of card. This can reduce the amount of different tooling required for each layer.

Figure 7:
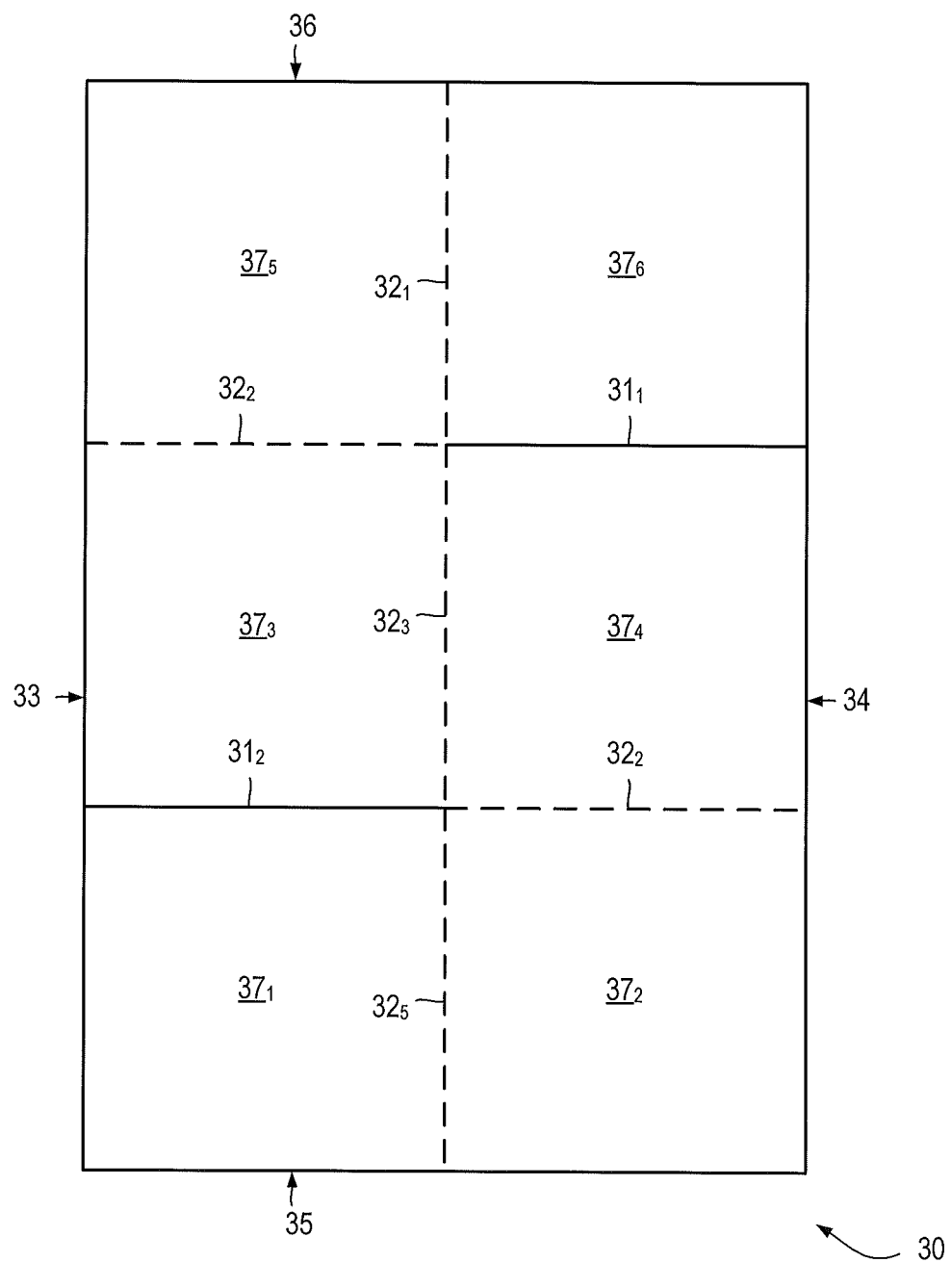
FIG. 7 is a plan view of a sheet which can be folded to form a laminate.

Referring to FIG. 7, a sheet 30 is shown which includes a set of slits $31_1$, $31_2$ and fold lines $32_1$, $32_2$, $32_3$. The sheet 30 is rectangular having first and second long edges 33, 34 and short ends 35, 36. The slits $31_1$, $31_2$ into the sheet 30 perpendicularly to the edges 33, 34 and define six areas $37_1$, $37_2$, $37_3$, $37_4$, $37_5$, $37_6$.

Figure 8:
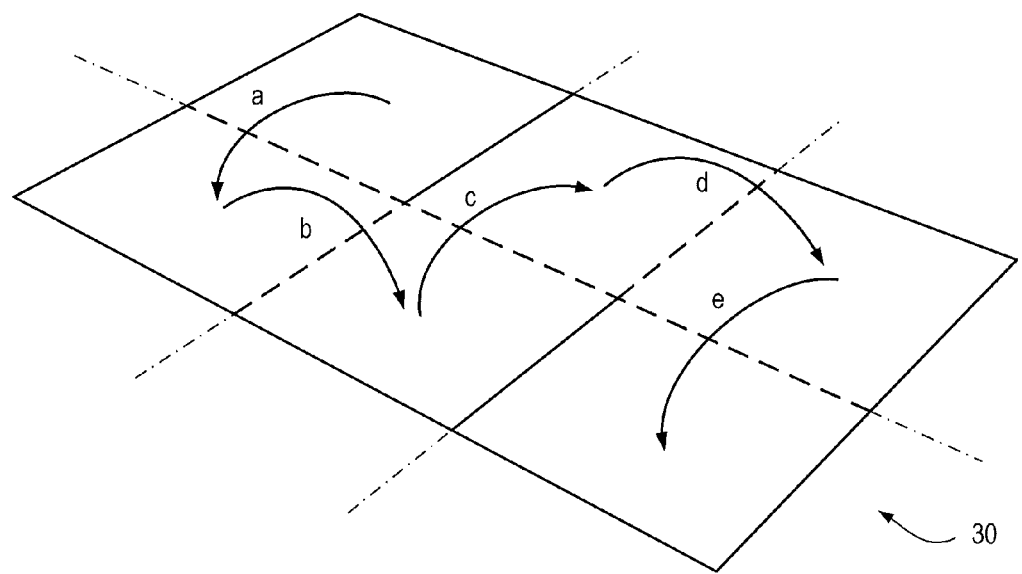
FIG. 8 is a perspective view of a first way in which a sheet can be folded.

Referring to FIG. 8, a six-layer stack can be formed by folding the areas on top of each other using folds a, b, c, d, e, f.

Figure 9:
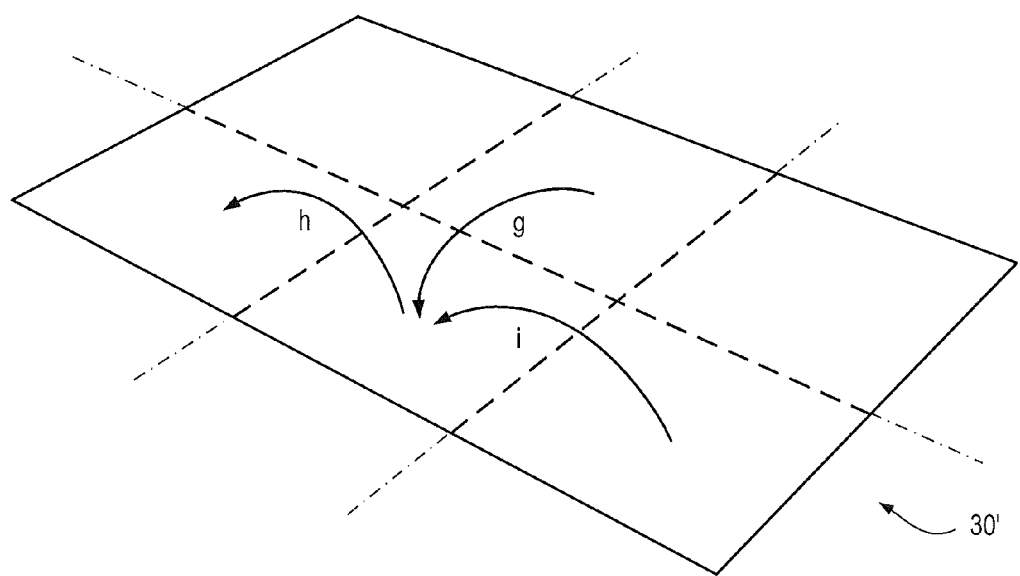
FIG. 9 is a perspective view of a second way in which a sheet can be folded.

Referring to FIG. 9, a six-layer stack can be formed without using any slits by folding a sheet 30' along line g, then along line h and then line i.

Thus, the interactive article 1 shown in FIG. 1 can be fabricated from a single sheet using this approach which helps to simplify manufacture.

As explained earlier, the interactive article 1 (FIG. 1) can include switches. Such switches can be formed in the laminate using or not using cavities.

Figure 10:
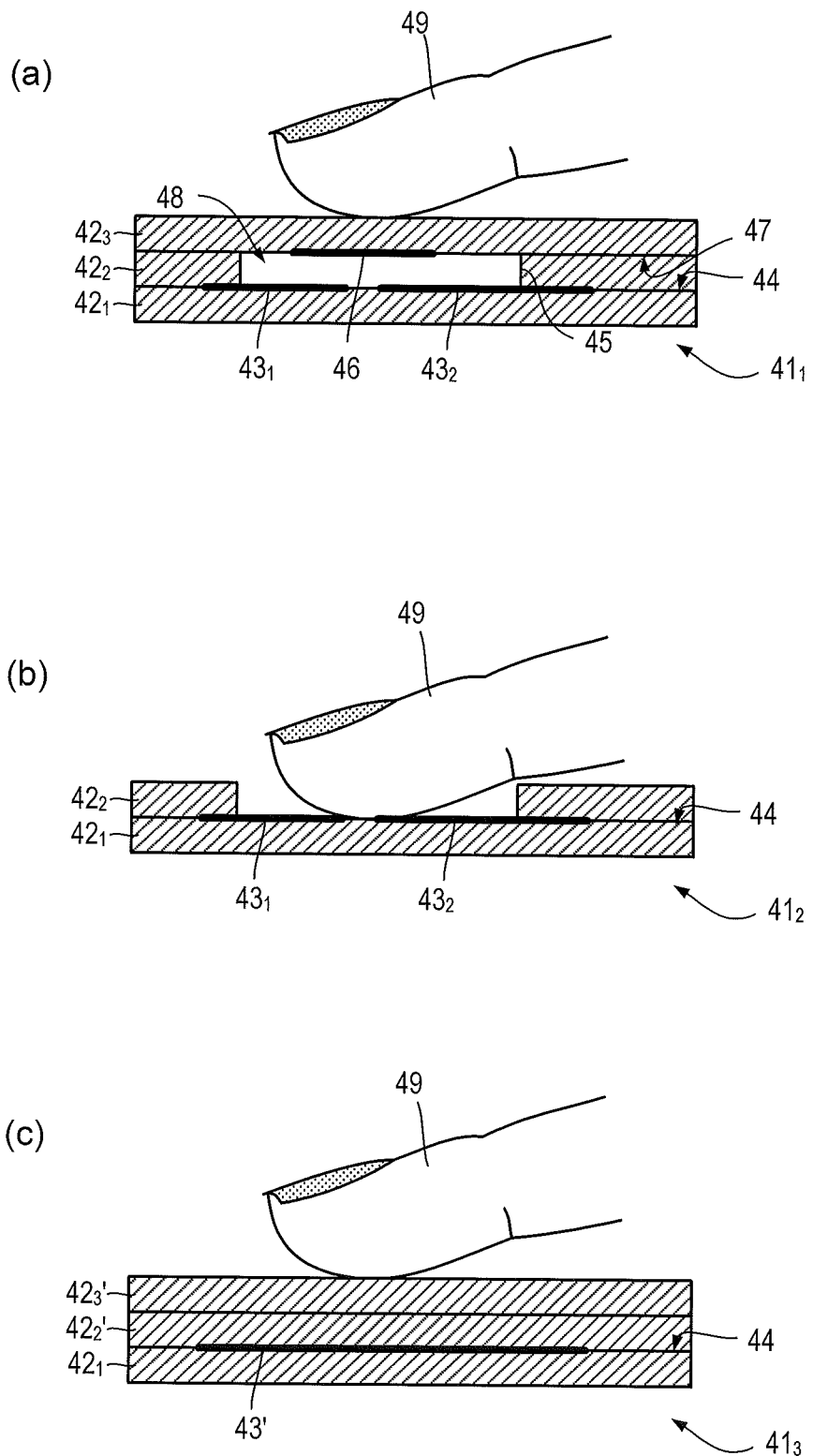
FIG. 10a illustrates a first type of user input device.
FIG. 10b illustrates a second type of user input device.
FIG. 10c illustrates a third type of user input device.

Referring to FIGS. 10a to 10c, first, second and third electrical switches are shown.

FIG. 10a shows a first push button switch $41_1$. The switch $41_1$ can be formed using three layers $42_1$, $42_2$, $42_3$. The layers include a first bottom layer $42_1$, a second intermediate layer $42_2$ and a third, top layer $42_3$. Two pads of conductive material $43_1$, $43_2$ comprising, for example, conductive ink are formed on an upper surface 44 of the bottom layer $42_1$. The second layer $42_3$ has an aperture 45 which is aligned with the conductive pads $43_1$, $43_2$ so that both pads are visible through the aperture 45. The top layer $42_3$ has a pad of conductive material 46, which again can be conductive ink, disposed on an underside 47 of the layer $42_3$. Laminating the layers $42_1$, $42_2$, $42_3$ forms a cavity 48.

As shown in FIG. 10a, the user can press their finger 49 on the topside 5 of the top sheet $42_3$ and press the top conductive pad 46 and bridges the bottom two conductive pads $43_1$, $43_2$.

FIG. 10b shows another switch $41_2$. The switch is similar to the first switch 411 shown in FIG. 10b except that the top sheet $43_2$ and top contact 46 are omitted. The two conductive pads $43_1$, $43_2$ are bridged directly by the user's finger 49.

FIG. 10c shows a capacitive sensing element $41_3$.

In this case, second and third layers $42_2'$, $42_3'$ cover a pad of conductive material 43', e.g. conductive ink, disposed on the upper surface 44 of the bottom sheet $42_1$. The pad is sensitive to capacitance change due to the user's finger 49.

It will be appreciated that many modifications may be made to the embodiments hereinbefore described.

The laminate can comprise fewer layers or more layers. For example, the laminate may comprise only two layers.

The sheets need not be made of card, but can be formed from paper or another fibre-based material. The sheets may be formed from a plastic. Laminated sheets, for example comprising sheets of card and plastic, may be used.

The invention claimed is:

1. A device comprising:
   a laminate which comprises at least four layers including first and second outer layers and first and second intermediate layers interposed between the first and second outer layers; and
   a plurality of electronic components disposed between the first and second outer layers;
   wherein at least one of the at least four layers support conductive tracks arranged to connect to corresponding electronic components of the plurality of electronic components and the second intermediate layer supports at least one conductive track,
   wherein the first and second intermediate layers overlap and an overlapping portion of the first intermediate layer lies in a plane, and
   wherein a non-overlapping portion of the second intermediate layer lies above or lies in plane with the plane of the overlapping portion of the first intermediate layer, and an overlapping portion of the second intermediate layer lies below the overlapping portion of the first intermediate layer, and wherein the at least four layers are laminated together by an adhesive between each layer of the laminate.

2. The device according to claim 1, wherein the conductive tracks comprise conductive ink printed on at least one of the at least four layers.

3. The device according to claim 2, wherein the conductive ink comprises a metal-based conductive ink, optionally a silver-based conductive ink, or a carbon-based ink.

4. The device according to any claim 1, wherein the at least four layers include sheets of card.

5. The device according to claim 1, wherein at least one intermediate layer is configured to provide at least one cavity.

6. The device according to claim 5, wherein each of the first intermediate layer or the second intermediate layer include at least one aperture.

7. The device according to claim 1, wherein the laminate has a thickness of at least 2 mm.

8. The device according to claim 1, wherein the laminate has a thickness no more than 50 mm.

9. The device according to claim 1, wherein an outer face of the laminate has an area of at least 50 cm$^2$.

10. The device according to claim 1, wherein an outer face of the laminate has an area of at least 500 cm$^2$.

11. The device according to claim 1, wherein the laminate includes at least five layers.

12. The device according to claim 1, wherein the at least four layers were formed from portions of a sheet.

13. The device according to claim 12, wherein the sheet was folded to form the laminate.

14. The device according to claim 12, wherein the sheet includes at least one slit or slot extending between an edge of the sheet and a line along the sheet, wherein the slit or slot allows a first portion of the sheet on one side of the slit or slot to be folded along a first section of the line in a first direction of folding, and a second portion of the sheet on the other side of the slit or slot to be left unfolded or to be folded along a second section of the line in a second, opposite direction of folding.

15. The device according to claim 12, wherein the laminate was trimmed so as to remove folded edges.

16. The device according to claim 1, wherein the plurality of electronic components include a battery.

17. The device according to claim 1, wherein the plurality of electronic components include a speaker.

18. The device according to claim 1, wherein the plurality of electronic components include an integrated circuit.

19. The device according to claim 1, wherein the device further comprises at least one switch.

20. The device according to claim 19, wherein the at least one switch is formed using at least three layers of the laminate and comprises a first region of conductive material disposed on a surface of a first layer which is one of the at least three layers of the laminate and a second region of conductive material disposed on a facing surface of a second layer which is one of the at least three layers of the laminate, wherein a third layer which is one of the at least three layers of the laminate spaces apart the first and second layers.

21. The device according to claim 19, wherein the at least one switch comprises a capacitive sensing switch.

22. The device according to claim 1, wherein the device further comprises at least one light emitter.

23. The device according to claim 1, which is a printed article.

24. The device according to claim 1, which is a book.

25. The device according to claim 1, which is a game.

26. The device according to claim 1, which is a greeting card.

27. The device of claim 1, wherein a bottom surface of one of the plurality of electronic components is mounted on the first outer layer, wherein the one of the plurality of electronic components is in a cavity of the laminate and wherein the at least one conductive track supported by the second intermediate layer makes contact with a conductive contact on a top surface of the one of the plurality of electronic components and also makes contact with a first conductive track on the first outer layer.

28. The device of claim 27, wherein the at least four layers further include a third intermediate layer, wherein a part of the non-overlapping portion of the second intermediate layer that lies above the overlapping portion of the first intermediate layer, when the part is in plane with the third intermediate layer.

29. The device of claim 27, wherein the bottom surface of the one of the plurality of electronic components has a conductive contact thereon that makes contact with a second conductive track that is on the first outer layer.

30. The device of claim 29, wherein the one of the plurality of electronic components is a battery.

31. The device of claim 27, wherein the non-overlapping portion of the second intermediate layer is bent in part so as to route the at least one conductive track supported by the second intermediate layer between the conductive contact on the top surface of the one of the plurality of electronic components and the first conductive track on the first outer layer.

32. The device of claim 31, wherein the one of the plurality of electronic components is a battery.

33. The device of claim 27, wherein the one of the plurality of electronic components is a speaker.

34. The device of claim 1, wherein one or more of the at least one of the plurality of electronic components is a microcontroller housed in a cavity inside the laminate.

35. The device of claim 1, wherein the at least four layers comprise fiber-based material, plastic, or both fiber-based material and plastic.

36. The device of claim 35, wherein a bottom surface of one of the plurality of electronic components is mounted on the first outer layer, wherein the one of the plurality of electronic components is in a cavity of the laminate and wherein the at least one conductive track supported by the second intermediate layer makes contact with a conductive contact on a top surface of the one of the plurality of electronic components and also makes contact with a first conductive track on the first outer layer.

* * * * *